(12) United States Patent
Mackensen et al.

(10) Patent No.: US 11,788,508 B2
(45) Date of Patent: Oct. 17, 2023

(54) METHOD FOR CONTROLLING A WIND POWER INSTALLATION

(71) Applicant: Wobben Properties GmbH, Aurich (DE)

(72) Inventors: Ingo Mackensen, Aurich (DE); Stefan Gertjegerdes, Aurich (DE); Christian Strafiel, Aurich (DE)

(73) Assignee: Wobben Properties GmbH, Aurich (DE)

( * ) Notice: Subject to any disclaimer, the term of this patent is extended or adjusted under 35 U.S.C. 154(b) by 137 days.

(21) Appl. No.: 17/144,818

(22) Filed: Jan. 8, 2021

(65) Prior Publication Data

US 2021/0215135 A1 Jul. 15, 2021

(30) Foreign Application Priority Data

Jan. 14, 2020 (DE) ..................... 10 2020 100 715.9

(51) Int. Cl.
| | | |
|---|---|---|
| *G01R 31/00* | (2006.01) |
| *F03D 7/02* | (2006.01) |
| *F03D 9/25* | (2016.01) |
| *G01R 19/00* | (2006.01) |
| *G01R 27/16* | (2006.01) |
| *H02J 3/38* | (2006.01) |
| *H02J 3/44* | (2006.01) |

(52) U.S. Cl.
CPC ........... *F03D 7/0284* (2013.01); *F03D 9/255* (2017.02); *G01R 19/0038* (2013.01); *G01R 27/16* (2013.01); *H02J 3/381* (2013.01); *H02J 3/44* (2013.01); *H02J 2300/28* (2020.01)

(58) Field of Classification Search
USPC .......................................... 324/76.11, 76, 39
See application file for complete search history.

(56) References Cited

U.S. PATENT DOCUMENTS

| | | | |
|---|---|---|---|
| 9,903,344 B2 * | 2/2018 | Rodionov | F03D 9/255 |
| 2010/0133831 A1 * | 6/2010 | Scholte-Wassink | F03D 7/043 290/44 |
| 2017/0358997 A1 * | 12/2017 | Andersen | H02M 5/4585 |
| 2019/0219029 A1 | 7/2019 | Biris et al. | |
| 2020/0195012 A1 * | 6/2020 | Wagoner | F03D 9/255 |

FOREIGN PATENT DOCUMENTS

| | | |
|---|---|---|
| DE | 102018100084 A1 | 7/2019 |
| WO | 2011/160643 A2 | 12/2011 |

* cited by examiner

*Primary Examiner* — Vincent Q Nguyen
(74) *Attorney, Agent, or Firm* — SEED INTELLECTUAL PROPERTY LAW GROUP LLP

(57) ABSTRACT

A method for controlling a wind power installation includes measuring a grid voltage of an electrical power supply grid, setting a DC-link voltage at a converter of the wind power installation depending on the measured grid voltage and using a first time constant and a second time constant, wherein the first time constant is different than the second time constant.

10 Claims, 3 Drawing Sheets

METHOD FOR CONTROLLING A WIND POWER INSTALLATION

BACKGROUND

Technical Field

The disclosure relates to a method for controlling a wind power installation and to such a wind power installation.

Description of the Related Art

Generally, wind power installations inject the electrical power generated from the wind into the electrical power supply grid by means of a converter.

This may result in reactions from the electrical power supply grid on the converter, and there in particular on the DC-link voltage of the converter.

It may therefore arise, for example, that these reactions result in the DC-link voltage of the converter fluctuating severely, as a result of which the converter no longer operates optimally or can no longer be operated at an optimum working point.

Such reactions can occur in particular in soft electrical power supply grids, i.e., electrical power supply grids with a low short-circuit power ratio (SCR for short).

BRIEF SUMMARY

Provided are techniques which results in an optimization or smoothing of the DC-link voltage, and thus to a stabilization of the output variables of a converter of a wind power installation, preferably, even when the wind power installation is connected to a soft electrical power supply grid. Provided is a method for controlling a wind power installation, comprising the steps of: measuring a grid voltage of an electrical power supply grid, and, setting a DC-link voltage at a converter of the wind power installation depending on the measured grid voltage and, using a first time constant and a second time constant, wherein the first time constant is different than the second time constant.

It is therefore in particular proposed to operate the converter of a wind power installation depending on a measured grid voltage of an electrical power supply grid, in particular by means of a working point-dependent DC-link voltage.

The setting of the DC-link voltage in this case takes place depending on a measured grid voltage and preferably on a or the working point of the converter.

The first time constant and the second time constant have the object of damping the direct coupling between the working point-dependent DC-link voltage and the grid voltage of the electrical power supply grid, in particular such that the influence of the grid voltage on the DC-link voltage is lessened.

For this purpose, the disclosure proposes in particular that the first time constant is different than the second time constant. For example, the first time constant is less than 0.1 second, and the second time constant is approximately 1 second.

This means in particular that the influence of the grid voltage on the DC-link voltage is handled differently for a rise or a drop in the grid voltage.

It is therefore in particular proposed that the converter, and there in particular the DC-link voltage, decides or differentiates between a grid voltage rise of the electrical power supply grid and a grid voltage drop of the electrical power supply grid.

For this purpose, it is in particular proposed, that, in the event of a rise in the grid voltage, a direct rise in the DC-link voltage takes place, and that, in the event of a drop in the grid voltage, a slow reduction in the DC-link voltage takes place.

It is therefore in particular also proposed, that the converter is operated with two different gradients, namely a steep gradient for the DC-link voltage in the event of a rise in the grid voltage and a flat gradient for the DC-link voltage in the event of a drop in the grid voltage.

It is thus, in particular, possible to optimize the output variables of a converter of a wind power installation in such a way that the wind power installation can also be connected to a soft electrical power supply grid, in particular without the wind power installation or without the operating behavior of the wind power installation having a negative effect on the electrical power supply grid.

Here, a soft power supply grid is understood to mean in particular grid sections and/or grid connection points which respond in a sensitive manner to changes in the injection from the generating units, i.e., for example, grid connection points with a short-circuit ratio (SCR for short) of less than 6 or less than 4.

Preferably, the method for controlling a wind power installation further comprises the following step: establishing a positive or negative grid voltage change depending on the measured grid voltage, wherein the first time constant is assigned to a positive grid voltage change, and the second time constant is assigned to a negative grid voltage change.

It is therefore, in particular, proposed that the measuring of the grid voltage is repeated, in particular continuously, and that a voltage change in the grid voltage of the electrical power supply grid is determined from the thus measured grid voltages. This voltage change in the grid voltage of the electrical power supply grid can also be referred to as grid voltage change.

Preferably, in addition, a distinction is drawn between a positive and a negative grid voltage change.

In addition, the first time constant is assigned to each positive grid voltage change, and the second time constant is assigned to each negative grid voltage change.

It is therefore, in particular, also proposed that the first and the second time constants are used independently of the absolute value of the voltage change; for example, the first time constant is 0 seconds for all positive grid voltage changes and 0.5 seconds for all negative grid voltage changes.

By virtue of such a selection of the time constants, it is possible in particular to damp the direct coupling between the working point-dependent DC-link voltage and the grid voltage, and thus in particular the influence of the grid voltage on the DC-link voltage is reduced.

In addition, it has been identified according to the disclosure that, given the correct choice of the time constants, as described above and below, smoothing of the DC-link voltage results, as a result of which the converter has working points which are more optimal.

Preferably, the method for controlling a wind power installation further comprises the following step: measuring a line impedance of a line reactor, wherein the DC-link voltage is additionally set depending on the measured impedance.

It is therefore also proposed likewise to take into consideration the impedance of any line reactor which may be arranged at the output of the converter.

Preferably, the method for controlling a wind power installation further comprises the following step: measuring a phase angle and/or an amplitude of a current to be injected, wherein the DC-link voltage is additionally set depending on the measured phase angle and/or the measured amplitude of the current to be injected.

It is therefore additionally also proposed to take into consideration the phase angle and/or the amplitude of the current to be injected.

In a particularly preferred embodiment, it is therefore proposed that the DC-link voltage is set depending on a grid voltage change of the electrical power supply grid, the impedance of the line reactor, the phase angle and the amplitude of the current to be injected.

Preferably, the first time constant is in a range of between 0 and 1 seconds, preferably below 0.2 seconds, particularly preferably the first time constant is substantially 0 seconds.

It is therefore in particular also proposed that, in the event of a rise in the grid voltage, a direct rise in the DC-link voltage results.

Preferably, the second time constant is in a range of between 0 and 5 seconds, preferably between 0.5 and 4 seconds, particularly preferably above 1 second.

It is therefore in particular proposed that, in the event of a drop in the grid voltage, the DC-link voltage is corrected only slowly, for example by means of a flat gradient.

The DC-link voltage of the converter is therefore controlled in such a way that, in the event of a drop in the grid voltage, the DC-link voltage responds with a time delay.

The disclosure further proposes the use of a method as described above or below in a wind power installation which is connected to an electrical power supply grid which has a comparatively high line impedance and/or is in the form of a soft grid and/or has a low short-circuit power ratio, in particular an SCR of less than 6.

It is therefore also proposed to use methods described above or below in particular in the case of wind power installations which are connected to a soft electrical power supply grid.

Preferably, therefore, the wind power installation is connected to an electrical power supply grid which has a comparatively high line impedance and/or is in the form of a soft grid and/or has a low short-circuit current ratio (SCR for short).

The disclosure further proposes a wind power installation, comprising: a converter, which has a DC link with a DC-link voltage, and which is designed to inject electrical power into an electrical power supply grid depending on a measured grid voltage, and a controller, which is at least designed to measure a grid voltage of an electrical power supply grid and to set the DC-link voltage using a first and a second time constant.

It is therefore in particular proposed that the method described above or below is implemented by a controller, which preferably uses the described time constants to set the DC-link voltage of a converter.

Preferably, the controller is further designed to establish whether there is a positive or negative grid voltage change within the electrical power supply grid.

Preferably, the wind power installation further comprises means which are designed to measure a phase angle of a current to be injected and/or an amplitude of a current to be injected.

These means may be, for example, measuring devices or measuring instruments (sensors) which are arranged at the output of the converter, i.e., between the converter and the electrical power supply grid.

Preferably, the controller is further designed to implement a method described above or below.

Preferably, the converter is part of a full-power converter concept of the wind power installation, and the DC-link voltage of the converter is set by means of a step-up converter and/or a DC-DC converter.

It is in particular therefore also proposed that the wind power installation is a wind power installation with a full-power converter concept, such as described by way of example below.

BRIEF DESCRIPTION OF THE SEVERAL VIEWS OF THE DRAWINGS

The present disclosure will now be explained in more detail below by way of example and using exemplary embodiments with reference to the attached figures, wherein the same reference symbols are used for identical or similar component parts. In the drawings.

DETAILED DESCRIPTION

Figure 1:
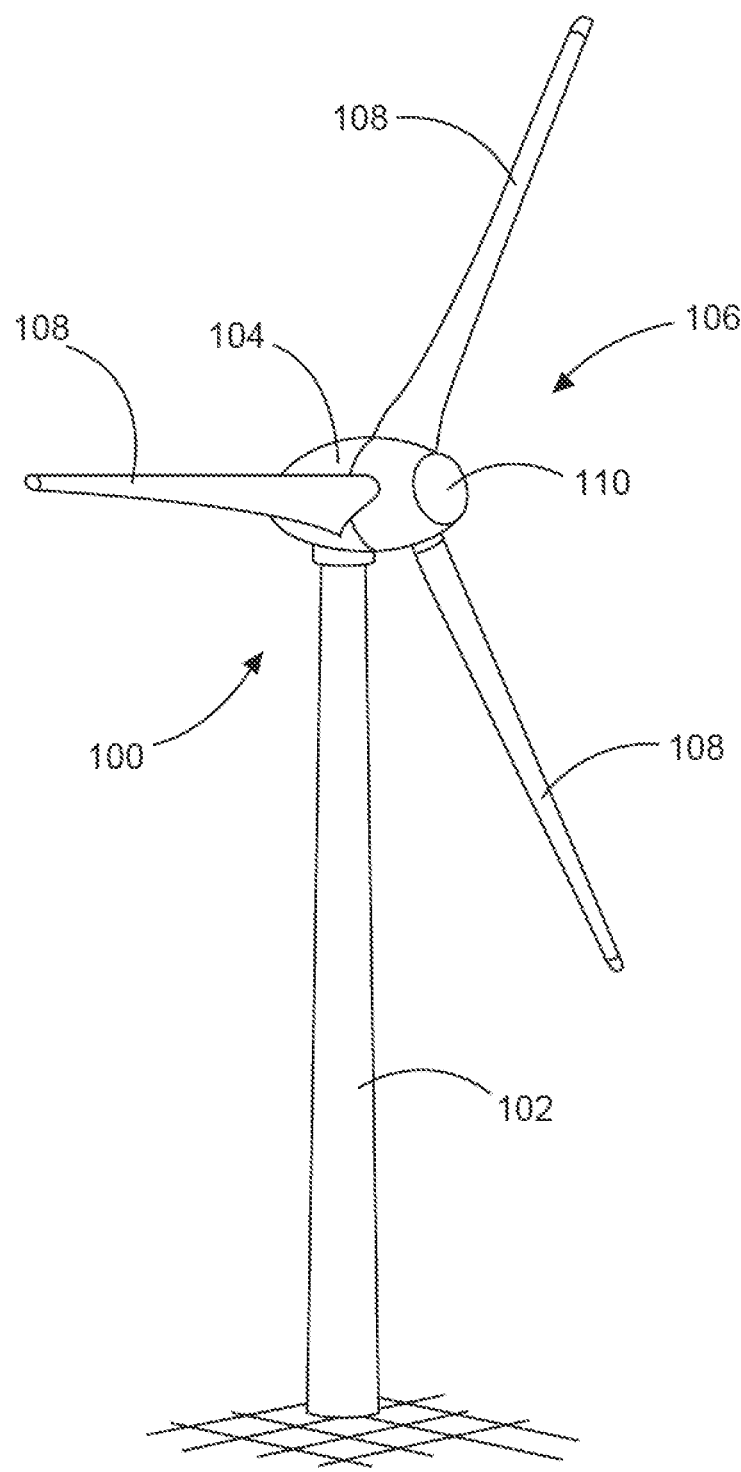
FIG. 1 shows a schematic illustration, by way of example, of a perspective view of a wind power installation in one embodiment.

FIG. 1 shows a perspective view of a wind power installation 100.

The wind power installation 100 has, in addition, a tower 102 and a nacelle 104. An aerodynamic rotor 106 having three rotor blades 108 and a spinner 110 is arranged on the nacelle 104. The rotor 106 is set in rotary motion during operation by the wind and thus drives a generator in the nacelle. As a result, the generator generates a current to be injected, which is injected into an electrical power supply grid by means of an inverter.

Figure 2:
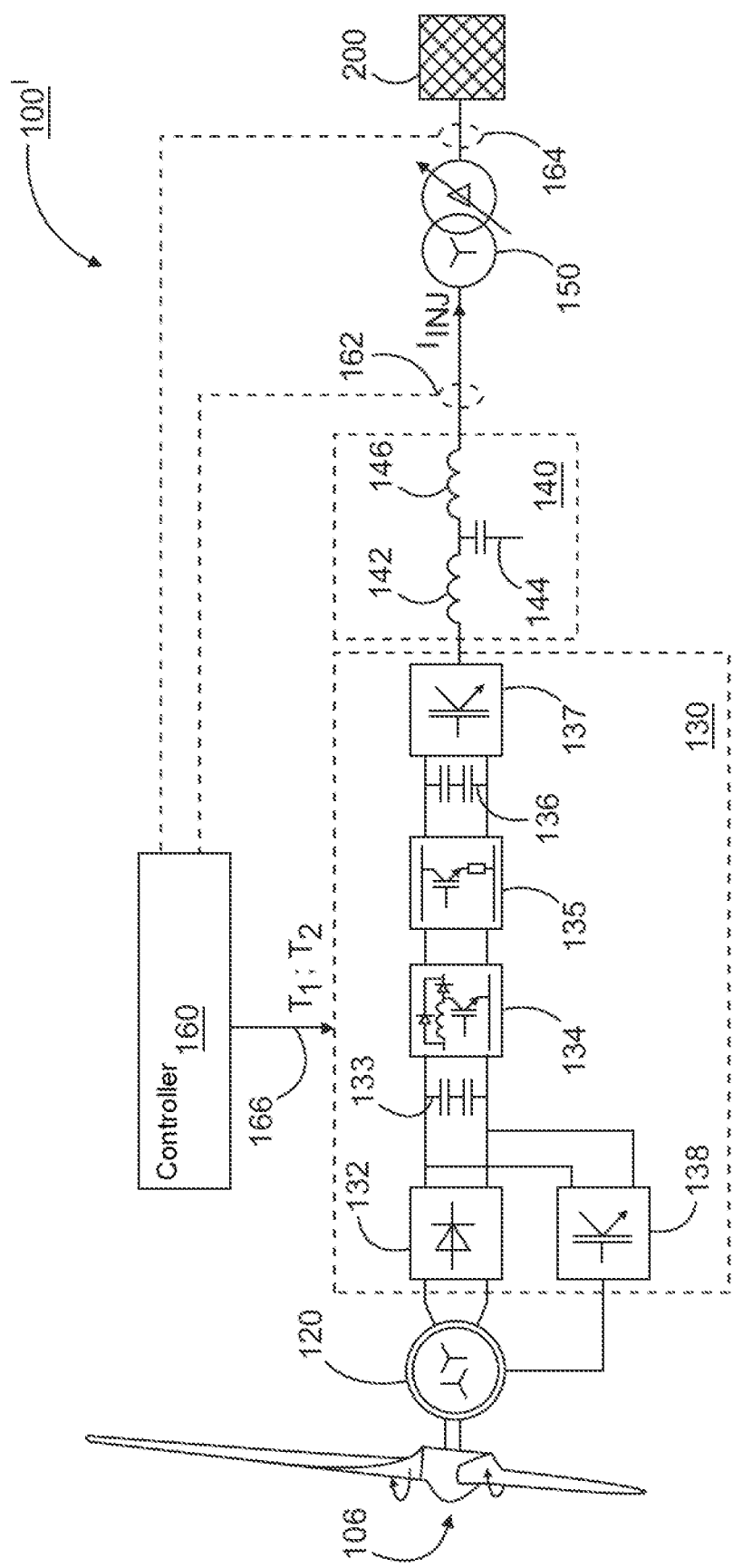
FIG. 2 shows a schematic illustration, by way of example, of a design of an electrical phase of a wind power installation according to the invention.

FIG. 2 shows a schematic illustration, by way of example, of an electrical phase 100' of a wind power installation 100 according to the disclosure, as shown preferably in FIG. 1.

The aerodynamic rotor of the wind power installation 106 is connected to the generator 120 of the wind power installation. Preferably, the generator 120 is in this case in the form of a six-phase ring generator.

In addition, the generator 120 is connected to an electrical power supply grid 200 via a converter 130 by means of a grid protection device 140 and a transformer 150.

In order to convert the electrical power generated by the generator 120 into a current $I_{INJ}$ to be injected, the converter 130 has, at the converter input, a rectifier 132. The rectifier 132 is additionally connected to a first DC link 133. The first DC link 133 is in turn connected to a step-up converter 134. The step-up converter 134 is in turn connected to a chopper 135. The chopper 135 is in turn connected to a second DC link 136. The second DC link 136 is in turn connected to an inverter 137. The inverter 137 itself in this case forms the converter output, which is provided with a grid protection device 140.

The grid protection device 140 comprises, for example, an interaction-limiting reactor 142, a filter 144 and a line reactor 146. In a preferred embodiment, the grid protection device 140 is therefore in the form of an LCL filter.

In order to inject the current $I_{INJ}$ to be injected into the electrical power supply grid 200, in addition a wind power installation transformer 150 is provided, which is preferably star-delta connected.

The electrical power supply grid 200 to which the wind power installation 100 is connected by means of the transformer 150 may be, for example a wind farm grid or an electrical power supply grid or distribution grid.

In order to control the electrical phase 100', in addition a controller 160 is provided.

The controller 160 is designed to measure the current $I_{INJ}$ to be injected by means of a current measurement sensor 162. In addition, the controller also has voltage measurement sensor 164, which are designed to measure a grid voltage of the electrical power supply grid 200.

In a particularly preferred embodiment, the controller 160 is additionally designed to measure the phase angle and the amplitude of the current $I_{INJ}$ to be injected as well.

In a further embodiment, the controller is also designed to determine the impedance of the grid protection device 140. This can take place, for example, via a measurement or by a parameterization of the controller 160.

From the thus measured values, i.e., for example, the grid voltage and the phase angle, the controller then determines the time constants T1 and T2, which are passed on to the converter 130 by means of a signal line 166. Alternatively, the time constants can also be calculated or simulated and then parameterized in the wind power installation.

However, it is also conceivable for the converter 130 to have an active rectifier, which combines the principles of operation of the component parts 132, 133, 134 such that the time constants T1 and T2 are then used to activate this active rectifier.

In addition, the converter 130 has a field current unit 138, which is designed to provide a field current for the generator 120 from the DC link 133.

The principles of operation resulting from such a design will now be described below with reference to FIG. 3.

Figure 3:
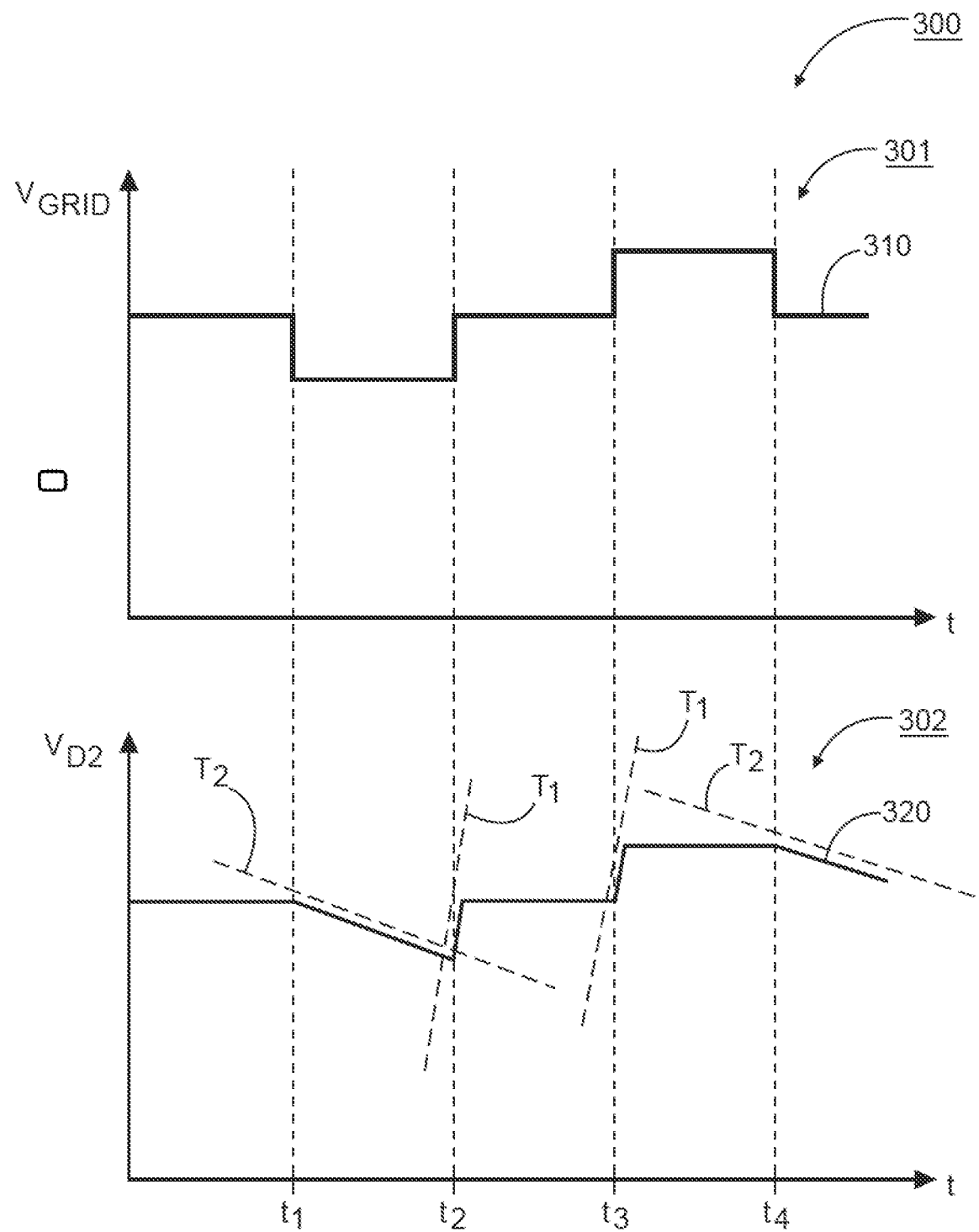
FIG. 3 shows a schematic illustration, by way of example, of the characteristic of a DC-link voltage of an inverter, which is operated using a method according to the invention, depending on a grid voltage.

FIG. 3 shows a schematic illustration, by way of example, of the characteristic of a DC-link voltage of an inverter of a wind power installation depending on a measured grid voltage using the method according to the disclosure.

In an upper graphical representation 301, the grid voltage of the electrical power supply grid $V_{grid}$ is plotted over time.

In a lower graphical representation 302, the DC-link voltage $V_{D2}$ is plotted over time. Preferably, the DC-link voltage $V_{D2}$ is the DC-link voltage of a second DC link 136, as shown in particular in FIG. 1.

The time characteristic in the graphical representations 301 and 302 is substantially time-synchronous. This is indicated by the dashed lines t1, t2, t3, t4, t5.

The graph 310 in the upper graphical representation 301 in this case shows the characteristic of the grid voltage $V_{grid}$ of the electrical power supply grid.

At time t1, this grid voltage $V_{grid}$ collapses, whereupon the DC-link voltage $V_{D2}$, which is indicated by the graph 320 in the lower graphical representation 302, is reduced slowly by means of the time constant T1.

At time t2, the grid voltage $V_{grid}$ recovers again or rises to its original level, whereupon the DC-link voltage $V_{D2}$ is raised directly again by means of the time constant T2.

At time t3, the grid voltage $V_{grid}$ of the electrical power supply grid rises suddenly, whereupon likewise the DC-link voltage $V_{D2}$ is raised directly again by means of the time constant T2.

At time t4, the grid voltage $V_{grid}$ drops again to its original level, whereupon the DC-link voltage $V_{D2}$ is lowered again slowly by means of the time constant T1.

The direct rise in the DC-link voltage $V_{D2}$ at times t2 and t3 is in this case caused by the time constant T1, which is substantially 0 seconds.

The slow reduction in the DC-link voltage from times t1 and t4 is in this case caused by the second time constant T2, which is substantially set to a value in the range of between 0.5 and 4 seconds.

By virtue of such a parameterization of the time constants T1 and T2, it is possible to smooth the DC-link voltage.

It has therefore been identified in accordance with the disclosure that such a design for the time constants T1 and T2 results in a better quality of the current $I_{INJ}$ to be injected.

This enables in particular operation of wind power installations on grids with sources of interference (for example large steel factories), on grids with a low SCR and/or enables a greater safety distance from stability limits of the electrical power supply grid and/or the wind power installation.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for controlling a wind power installation, comprising:
   measuring a grid voltage of an electrical power supply grid over a period of time, and
   setting a DC-link voltage at a converter of the wind power installation depending on the measured grid voltage and according to a first time constant over the period of time and a second time constant over the period of time,
   wherein the first time constant is different than the second time constant,
   operating the converter of the wind power installation at the DC-link voltage setting; and
   establishing a positive grid voltage change or a negative grid voltage change depending on the measured grid voltage,
   wherein the first time constant is assigned to the positive grid voltage change, and
   wherein the second time constant is assigned to the negative grid voltage change.

2. A method for controlling a wind power installation, comprising:
   measuring a grid voltage of an electrical power supply grid over a period of time, and
   setting a DC-link voltage at a converter of the wind power installation depending on the measured grid voltage and according to a first time constant over the period of time and a second time constant over the period of time,
   wherein the first time constant is different than the second time constant,
   operating the converter of the wind power installation at the DC-link voltage setting, and
   measuring an impedance of a line reactor,
   wherein setting the DC-link voltage depends on the measured impedance.

3. The method for controlling a wind power installation as claimed in claim 1, further comprising:

measuring at least a phase angle or an amplitude of a current to be injected into the electrical power supply grid, wherein setting the DC-link voltage depends on the measured phase angle or the measured amplitude of the current to be injected into the electrical power supply grid.

4. The method for controlling a wind power installation as claimed in claim 1, wherein the first time constant is in a range of between 0 and 1 second.

5. The method for controlling a wind power installation as claimed in claim 4, wherein the first time constant is less than 0.2 seconds.

6. The method for controlling a wind power installation as claimed in claim 1, wherein the second time constant is in a range of between 0 and 5 seconds.

7. The method for controlling a wind power installation as claimed in claim 6, wherein the second time constant is in a range of between 0.5 and 4 seconds.

8. A wind power installation connected to an electrical power supply grid, wherein the electrical power supply grid has a higher line impedance than a line impedance of a line reactor of the wind power installation, wherein the electrical power supply grid has a short-circuit power ratio of less than 6, the wind power installation being configured to perform the method for controlling the wind power installation as claimed in claim 1.

9. A wind power installation, comprising:

a converter having a DC link with a DC-link voltage, wherein the converter is coupled to an electrical power supply grid and configured to inject electrical power into the electrical power supply grid depending on a measured grid voltage, and a controller coupled to the converter and configured to:
receive the measured grid voltage of the electrical power supply grid over a period of time, cause the converter to set the DC-link voltage depending on the measured grid voltage and according to a first time constant over the period of time and a second time constant over the period of time, wherein the first time constant is different than the second time constant, and establish whether there is a positive grid voltage change or negative grid voltage change within the electrical power supply grid.

10. The wind power installation as claimed in claim 9, further comprising a sensor configured to measure a phase angle of a current to be injected in the electrical power supply grid or amplitude of the current to be injected in the electrical power supply grid, or both.

* * * * *